United States Patent
Senoo et al.

(10) Patent No.: US 9,692,011 B2
(45) Date of Patent: Jun. 27, 2017

(54) ELECTROLUMINESCENT APPARATUS

(71) Applicant: Sharp Kabushiki Kaisha, Osaka-shi, Osaka (JP)

(72) Inventors: Tohru Senoo, Osaka (JP); Tohru Sonoda, Osaka (JP); Takeshi Hirase, Osaka (JP); Tetsuya Okamoto, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 20 days.

(21) Appl. No.: 14/890,595

(22) PCT Filed: Feb. 25, 2014

(86) PCT No.: PCT/JP2014/054509
§ 371 (c)(1),
(2) Date: Nov. 12, 2015

(87) PCT Pub. No.: WO2014/185113
PCT Pub. Date: Nov. 20, 2014

(65) Prior Publication Data
US 2016/0087243 A1    Mar. 24, 2016

(30) Foreign Application Priority Data
May 13, 2013    (JP) ................. 2013-100936

(51) Int. Cl.
*H01L 51/52*    (2006.01)
*H01L 51/00*    (2006.01)
*H01L 27/32*    (2006.01)

(52) U.S. Cl.
CPC ........ *H01L 51/5259* (2013.01); *H01L 51/004* (2013.01); *H01L 51/0035* (2013.01);
(Continued)

(58) Field of Classification Search
CPC .. H01L 51/52; H01L 51/5253; H01L 51/5259
See application file for complete search history.

(56) References Cited

U.S. PATENT DOCUMENTS

2005/0269926 A1*  12/2005  Fukuoka ............ H01L 51/5246
                                                   313/123
2006/0097633 A1*  5/2006  Cho .................... H01L 51/5259
                                                   313/512
(Continued)

FOREIGN PATENT DOCUMENTS

JP    2004-319103 A    11/2004
JP    2005-174557 A    6/2005
(Continued)

OTHER PUBLICATIONS

Official Communication issued in International Patent Application No. PCT/JP2014/054509, mailed on Apr. 1, 2014.

*Primary Examiner* — Phuc Dang
(74) *Attorney, Agent, or Firm* — Keating & Bennett, LLP

(57) ABSTRACT

In an organic EL display device (electroluminescence device) including an organic EL element (electroluminescence element), the organic EL element is covered with a desiccant layer. Between a TFT substrate (substrate) and an opposite substrate, a frame-shaped moisture high-permeable layer and a frame-shaped sealing member are disposed in a state successively surrounding the desiccant layer.

18 Claims, 8 Drawing Sheets

(52) U.S. Cl.
CPC ...... *H01L 51/5246* (2013.01); *H01L 51/5253* (2013.01); *H01L 27/3244* (2013.01)

(56) References Cited

U.S. PATENT DOCUMENTS

| | | | |
|---|---|---|---|
| 2006/0170341 A1* | 8/2006 | Su | H01L 51/5253 |
| | | | 313/512 |
| 2007/0013292 A1 | 1/2007 | Inoue et al. | |
| 2009/0066243 A1 | 3/2009 | Sakurai | |
| 2009/0195147 A1 | 8/2009 | Song et al. | |
| 2011/0241528 A1* | 10/2011 | Choi | H01L 51/524 |
| | | | 313/317 |
| 2014/0252321 A1* | 9/2014 | Pyon | H01L 27/3216 |
| | | | 257/40 |

FOREIGN PATENT DOCUMENTS

| | | |
|---|---|---|
| JP | 2007-140061 A | 6/2007 |
| JP | 2009-070597 A | 4/2009 |
| JP | 2009-187941 A | 8/2009 |
| WO | 2004/071134 A1 | 8/2004 |

\* cited by examiner

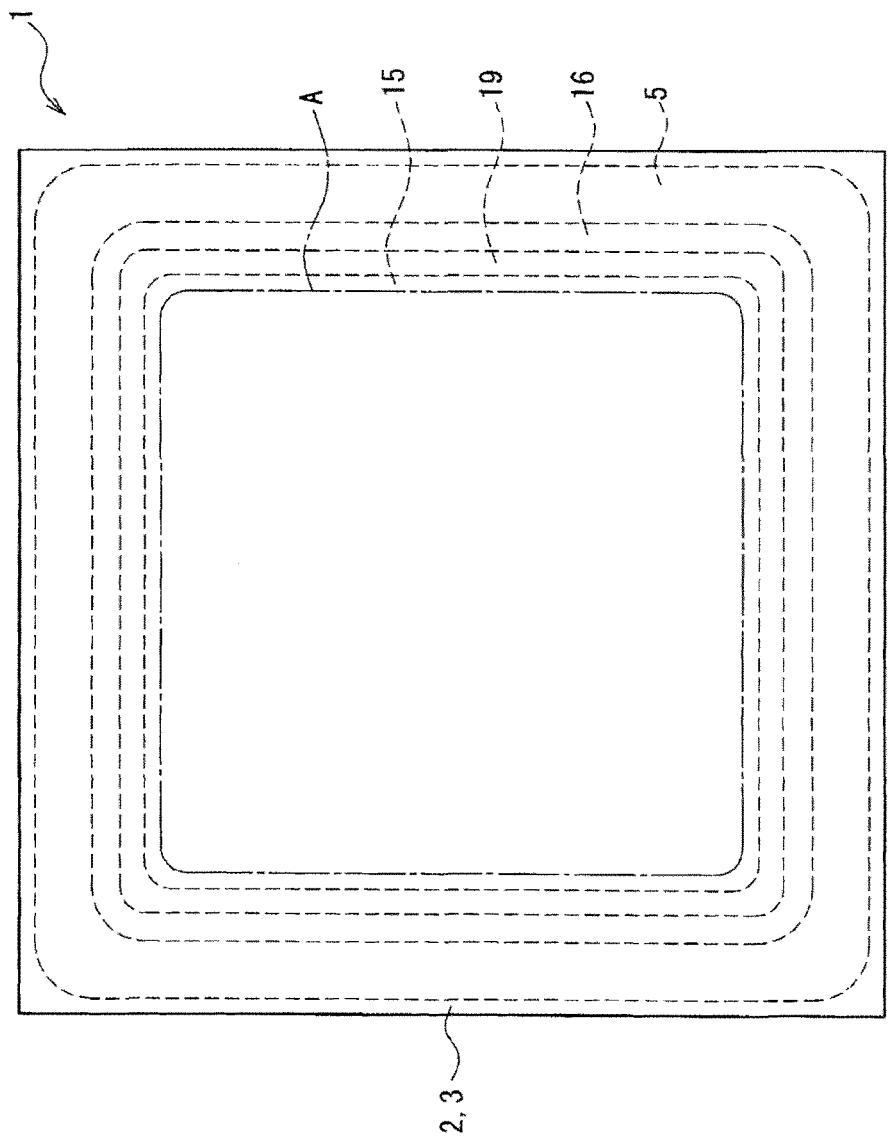

ELECTROLUMINESCENT APPARATUS

TECHNICAL FIELD

The present disclosure relates to an electroluminescence device including an EL (electroluminescence) element.

BACKGROUND ART

Recently, flat panel displays have been utilized in a variety of commodities and fields. It has, therefore, been demanded to provide a flat panel display with a larger size, higher image quality, and lower power consumption.

Under such a situation in the art, an organic EL (electroluminescence) display device including an organic EL element, which utilizes electroluminescence of an organic material, has received great attention as a flat panel display that is superior in being fully solid-state, drivable at a lower voltage, quick responsive, self-luminescent, etc.

In an active matrix organic EL display device, for example, thin-film organic EL elements are disposed on a substrate on which TFTs (thin-film transistors) are also disposed. In the organic EL element, organic EL layers including a luminescence layer are laminated between a pair of electrodes. The TFT is connected to one of the pair of electrodes. An image is displayed by applying a voltage between the pair of electrodes, thus causing the luminescence layer to emit light.

In the organic EL display device described above, however, the organic EL element may deteriorate due to moisture incoming from the outside. To prevent the deterioration of the organic EL element due to moisture, a related-art organic EL display device proposes a structure in which a moisture low-permeable sealing resin is formed around the organic EL element by the DAM & FILL method, and a desiccant (getter) is filled inside the sealing resin to provide a desiccant layer.

In the related-art organic EL display device described above, however, there is a possibility of impairing pixels or reducing display quality for the reason that, before reaching a full level of moisture absorption ability of the desiccant layer, damage of light emission characteristics caused by moisture may be progressed in pixels in the neighborhood of the desiccant layer, or cracking may occur in the desiccant layer at or near an outer periphery.

More specifically, in the related-art organic EL display device described above, moisture having penetrated through a sealing member (sealing resin) is absorbed by the desiccant layer. However, because the moisture is absorbed into the interior of the desiccant layer without being sufficiently diffused, absorption of the moisture is locally progressed in a region of the desiccant layer at or near the outer periphery more preferentially than in an inner region. Accordingly, the moisture absorption ability of the desiccant layer is saturated in its portion at or near the outer periphery at earlier timing than in the other portion, and intrusion of moisture into the pixels in the neighborhood of the desiccant layer can no longer be suppressed. Hence the light emission characteristics may be damaged. Furthermore, the desiccant layer causes cure shrinkage due to absorption of moisture. However, because the cure shrinkage is locally progressed only at or near the outer periphery, the desiccant layer may be distorted, and the distorted desiccant layer may be cracked eventually. The cracking of the desiccant layer may adversely affect the optical characteristics of the organic EL display device, and further damage the light emission characteristics of the pixels of the organic EL element if a layer including the pixels constituted therein is drawn to displace by the cracking.

To cope with the above problems, Patent Literature (PTL) 1, for example, given below proposes a related-art organic EL display device in which a first resin layer having higher moisture permeability than a second resin layer (sealing member) is disposed between the desiccant layer and the organic EL element. That related-art organic EL display device further proposes arrangements that a first moisture-resistant layer having lower moisture permeability than the first resin layer is disposed between the first resin layer and the organic EL element, and that a second moisture-resistant layer having lower moisture permeability than the first resin layer is disposed between the desiccant layer and the first resin layer. Thus, in the related-art organic EL display device described above, the first moisture-resistant layer is disposed on the organic EL element, and the first resin layer is disposed inside the second moisture-resistant layer. In addition, the second moisture-resistant layer and the desiccant layer are successively laminated inside the first resin layer, and the first resin layer is disposed on the first moisture-resistant layer.

In the related-art organic EL display device described above, because moisture having entered the second resin layer from the outside is not locally present in a peripheral portion of the second resin layer, and is diffused into the entirety of the first resin layer, local moisture absorption by the desiccant layer is suppressed, and the moisture can be uniformly absorbed by the entirety of the desiccant layer. Furthermore, in the related-art organic EL display device described above, the moisture having entered the first resin layer can be more preferentially guided to the side including the desiccant layer than to the side including the organic EL element with the presence of the first moisture-resistant layer, and can be more preferentially absorbed by the desiccant layer. Still further, in the related-art organic EL display device described above, the moisture having entered the first resin layer can be suppressed from being immediately absorbed by the desiccant layer with the presence of the second moisture-resistant layer, and the moisture having entered the first resin layer can be caused to sufficiently diffuse in the first resin layer over its entirety without being localized therein. As a result, moisture can be uniformly absorbed by the entirety of the desiccant layer, and local moisture absorption by the desiccant layer can be avoided.

CITATION LIST

Patent Literature

PTL 1: Japanese Unexamined Patent Application Publication No. 2005-174557

SUMMARY

Technical Problem

In the related-art organic EL display device (electroluminescence device) described above, however, the organic EL element (electroluminescence element) and the desiccant layer are arranged in a spaced relation with the first moisture-resistant layer, the first resin layer, and the second moisture-resistant layer interposed between them. In the related-art organic EL display device described above, therefore, part of the moisture having penetrated through the second resin layer (sealing member), the part being not diffused into the first resin layer, may be diffused into the first moisture-resistant layer and may reach the organic EL element without being absorbed by the desiccant layer. Furthermore, in the related-art organic EL display device described above, if the moisture once diffused into the first resin layer is re-diffused into the first moisture-resistant layer on the side opposite to the desiccant layer, that moisture may reach the organic EL element. Moreover, in the related-art organic EL display device described above, because the first moisture-resistant layer, the first resin layer, the second moisture-resistant layer, and the desiccant layer are successively laminated on the organic EL element, the inventor has noted that it is difficult to provide the desiccant layer having a sufficient thickness in some cases.

Consequently, the inventor has noted that the related-art organic EL display device described above still has a problem that, even though the local moisture absorption by the desiccant layer can be suppressed, a difficulty in ensuring reliable absorption of moisture by the desiccant layer may arise in combination with another reason that the desiccant layer is thin.

In consideration of the above-described problems, an object of the embodiment of the invention is to provide an electroluminescence device in which moisture can be reliably absorbed by a desiccant layer while local absorption of moisture is avoided.

Solution to Problem

The embodiment provides an electroluminescence device comprising a substrate and an electroluminescence element disposed on the substrate, the electroluminescence device further comprising:

an opposite substrate disposed in an opposite relation to the substrate and positioned on same side as the electroluminescence element;

a desiccant layer disposed between the substrate and the opposite substrate and covering the electroluminescence element;

a moisture high-permeable layer having frame-shape, the moisture high-permeable layer disposed between the substrate and the opposite substrate and surrounding the desiccant layer; and a sealing member having frame-shape, the sealing member disposed between the substrate and the opposite substrate, surrounding the moisture high-permeable layer, and sealing off the electroluminescence element in cooperation with the opposite substrate.

In the electroluminescence device constituted as described above, the electroluminescence element is covered with the desiccant layer. Between the substrate and the opposite substrate, the desiccant layer is surrounded successively by the moisture high-permeable layer having frame-shape and the sealing member having frame-shape. With such a structure, the electroluminescence device can be constituted in which, unlike the above-described related art, moisture can be reliably absorbed by the desiccant layer while local absorption of moisture is avoided. Stated in another way, moisture having penetrated through the sealing member can be caused to diffuse over the entirety of the desiccant layer with the presence of the moisture high-permeable layer, and local moisture absorption by the desiccant layer can be avoided. Furthermore, unlike the above-described related art, the thickness of the desiccant layer can be increased without problems, and the moisture absorption performance obtained with the desiccant layer can be easily increased. In addition, even when moisture having been diffused in the moisture high-permeable layer is further diffused toward the electroluminescence element, the moisture has to pass through the desiccant layer. Thus, the relevant moisture can be reliably absorbed by the desiccant layer.

In the electroluminescence device described above, a first hollow region may be disposed between the sealing member and the moisture high-permeable layer.

In that case, the local moisture absorption by the desiccant layer can be more reliably avoided with the presence of the first hollow region.

In the electroluminescence device described above, the first hollow region is preferably held in a state under low pressure of not higher than 1 Pa or a state filled with inert gas.

In that case, the first hollow region can be disposed in a more appropriate condition.

In the electroluminescence device described above, a second hollow region may be disposed between the moisture high-permeable layer and the desiccant layer.

In that case, the local moisture absorption by the desiccant layer can be more reliably avoided with the presence of the second hollow region.

In the electroluminescence device described above, the second hollow region is preferably held in a state under low pressure of not higher than 1 Pa or a state filled with inert gas.

In that case, the second hollow region can be disposed in a more appropriate condition.

In the electroluminescence device described above, the desiccant layer and the moisture high-permeable layer may be in close contact with each other, and the moisture high-permeable layer and the sealing member may be in close contact with each other.

In that case, the electroluminescence device having a compact size can be constituted easily.

In the electroluminescence device described above, the moisture high-permeable layer may be made of a resin material.

In that case, the moisture high-permeable layer can be formed easily.

In the electroluminescence device described above, a moisture permeation rate of the moisture high-permeable layer may be higher than a moisture permeation rate of the sealing member.

In that case, the moisture having penetrated through the sealing member can be caused to quickly diffuse by the moisture high-permeable layer.

Advantageous Effects of Invention

According to the embodiment of the invention, the electroluminescence device can be obtained in which moisture can be reliably absorbed by the desiccant layer while local absorption of moisture is avoided.

BRIEF DESCRIPTION OF DRAWINGS

FIGS. 4(a) and 4(b) illustrate a series of main manufacturing steps.

FIG. 8 is a plan view of the organic EL display device illustrated in FIG. 7.

DESCRIPTION OF EMBODIMENTS

Figure 1:
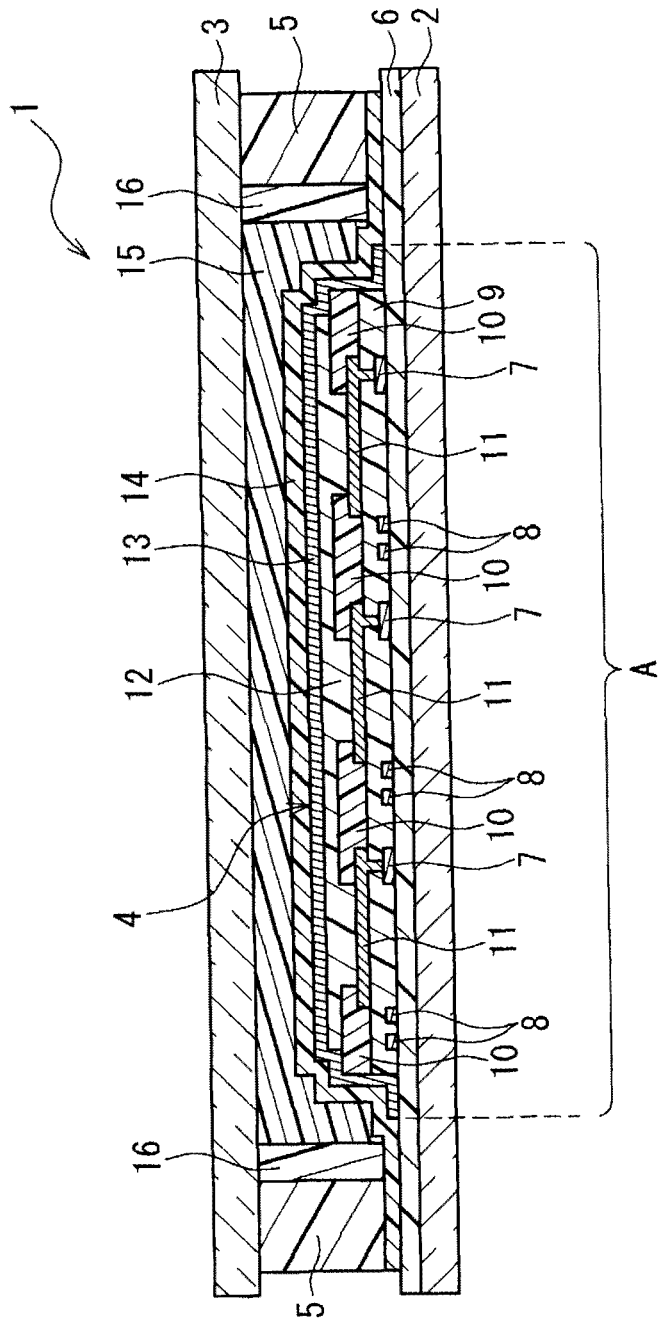
FIG. 1 is a sectional view referenced to explain an organic EL display device according to a first embodiment of the present invention.

Preferred embodiments implementing an electroluminescence device of the present invention will be described below with reference to the drawings. It is to be noted that the following description is made in connection with the case of applying the present invention to an organic EL display device. Individual components in the drawings are depicted in dimensions not exactly representing the actual dimensions of the components, the actual dimensional ratios between or among the components, and so on.

First Embodiment

Figure 2:
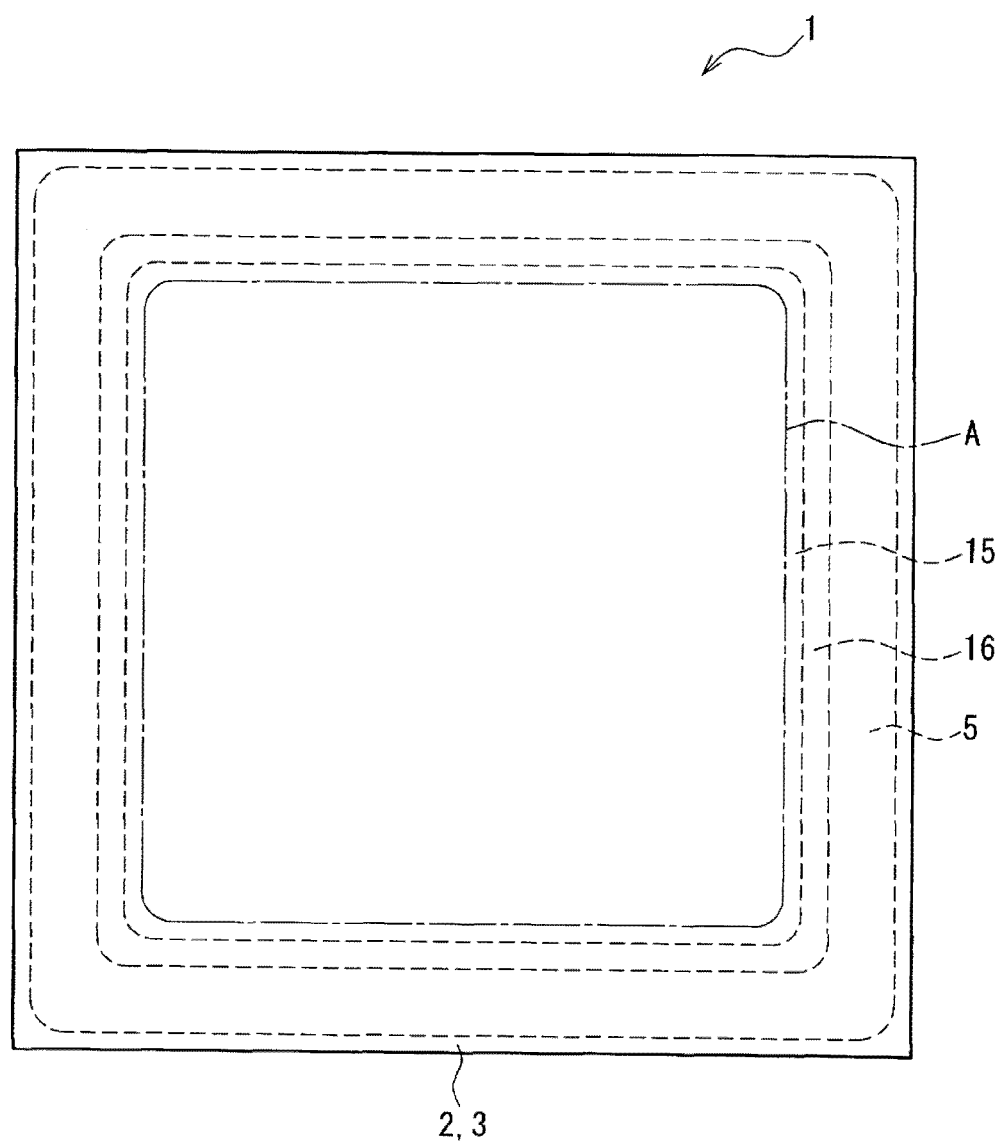
FIG. 2 is a plan view of the organic EL display device.

FIG. 1 is a sectional view referenced to explain an organic EL display device according to a first embodiment of the present invention. FIG. 2 is a plan view of the organic EL display device. In FIG. 1, the organic EL display device 1 of this embodiment includes a TFT substrate 2, i.e., an example of a substrate, and an organic EL element 4, i.e., an example of an electroluminescence element, disposed on the TFT substrate 2. The organic EL element 4 is sealed (enclosed) by the TFT substrate 2, an opposite substrate 3 disposed in an opposite relation to the TFT substrate 2, and a sealing member 5 disposed between the TFT substrate 2 and the opposite substrate 3.

Referring to FIG. 2 as well, in the organic EL display device 1 of this embodiment, the organic EL element 4 constitutes a pixel region A including a plurality of pixels. The organic EL element 4 is arranged inside a space surrounded by the TFT substrate 2, the opposite substrate 3, and the sealing member 5 disposed in the form of a frame. The pixel region A constitutes a display section of the organic EL display device 1, and it is configured to display information.

Returning to FIG. 1, the TFT substrate 2 and the opposite substrate 3 are each made of, e.g., a glass material. An underlying film (insulating film) 6 is disposed on the TFT substrate 2 in a state covering its entire surface, and a TFT (thin film transistor) 7 is disposed on the underlying film 6 for each pixel in the pixel region A. Wirings 8 including a plurality of source lines (signal lines) and a plurality of gate lines are also formed in a matrix pattern on the underlying film 6. A source driver and a gate driver (not illustrated) are connected to the source lines and the gate lines, respectively, to drive the TFT 7 per pixel in accordance with an image signal input from the outside. The TFT 7 functions as a switching element for controlling light emission of the corresponding pixel. The TFT 7 is configured to control light emission of corresponding one of the pixels constituted in the organic EL element 4, the one emitting light in any of red (R), green (G), and blue (B).

The underlying film 6 is to prevent the characteristics of the TFT 7 from being degraded due to diffusion of impurities from the TFT substrate 2 into the TFT 7. In the case where there is no possibility of such degradation, the underlying film 6 may be omitted.

Apart from the above description, the opposite substrate 3 may be constituted by employing a metal film made of, e.g., aluminum. More specifically, a thin metal film (metal foil) having a thickness of about 1 µm to 50 µm, for example, may be bonded to the sealing member 5 and a later-described desiccant layer 15 in a vacuum atmosphere such that the close contact with the sealing member 5 and the desiccant layer 15.

Furthermore, an interlayer insulating film 9, an edge cover 10, and a first electrode 11 of the organic EL element 4 are formed on the TFT substrate 2. The interlayer insulating film 9 functions as a planarizing film, and it is disposed on the underlying film 6 in a state covering both the TFTs 7 and the wirings 8. The edge cover 10 is formed on the interlayer insulating film 9 in a state covering a pattern end portion of the first electrode 11. The edge cover 10 also functions as an insulating layer to prevent short-circuiting between the first electrode 11 and a later-described second electrode 13. The first electrode 11 is connected to the TFT 7 through a contact hole that is formed in the interlayer insulating film 9.

An opening in the edge cover 10, i.e., a portion where the first electrode 11 is exposed from the edge cover 10, substantially constitutes a light-emitting region of the organic EL element 4. Thus, the organic EL display device 1 of this embodiment is configured to be able to display a full-color image by, as described above, emitting lights in RGB colors.

Moreover, an organic EL layer 12 and the second electrode 13 are formed on the first electrode 11. The organic EL element 4 is constituted by the first electrode 11, the organic EL layer 12, and the second electrode 13. In other words, the organic EL element 4 comprises, e.g., a light-emitting device that is able to emit high-luminance light with low-voltage DC drive, and it includes the first electrode 11, the organic EL layer 12, and the second electrode 13.

More specifically, when the first electrode 11 is an anode, a hole injection layer, a hole transport layer, a light-emitting layer, an electron transport layer, an electron injection layer, etc. are successively laminated (though not illustrated) from the side close to the first electrode 11 to constitute the organic EL layer 12. Moreover, the second electrode 13 is formed as a cathode. Apart from the above description, one of the above-mentioned layers may be constituted to have two or more functions. For example, one layer may serve as both the hole injection layer and the hole transport layer. A carrier blocking layer, etc. may be additionally inserted, as required, in the organic EL layer 12.

On the other hand, when the second electrode 13 is an anode, the order of the above-mentioned layers constituting the organic EL layer 12 is reversed to that described above.

When the first electrode 11 is constituted as a transparent electrode or a semi-transparent electrode and the second electrode 13 is constituted as a reflective electrode, the organic EL display device 1 is the bottom emission type in which light is emitted from the side including the TFT substrate 2. Conversely, when the first electrode 11 is constituted as a reflective electrode and the second electrode 13 is constituted as a transparent electrode or a semi-transparent electrode, the organic EL display device 1 is the top emission type in which light is emitted from the side including the opposite substrate 3.

In the organic EL display device 1 of this embodiment, a protective film 14 is formed on the organic EL element 4 not only to prevent the organic EL element 4 from being damaged during the step of forming the later-described desiccant layer 15 and by foreign matters, but also to avoid the organic EL element 4 from being damaged by intrusion of moisture and oxygen from the outside before the fabrication of the desiccant layer 15. Apart from the above description, the protective film 14 may be omitted in a modified structure.

In the organic EL display device 1 of this embodiment, as described above, the organic EL element 4 is sealed by the TFT substrate 2, the opposite substrate 3, and the sealing member 5. The sealing member 5 is constituted by dispersing spacers, which define a cell gap between the TFT substrate 2 and the opposite substrate 3, and inorganic particles in a resin, e.g., an epoxy resin. As illustrated in FIG. 2, the sealing member 5 is formed in a frame-like shape around the pixel region A. Moisture permeability of the sealing member 5 can be reduced by dispersing inorganic particles therein.

In the organic EL display device 1 of this embodiment, the desiccant layer 15 is disposed above the organic EL element 4 with the protective film 14 interposed between them. Stated in another way, the desiccant layer 15 is disposed between the TFT substrate 2 and the opposite substrate 3 in a state covering the organic EL element 4. The desiccant layer 15 is constituted by dispersing, in a resin, a metal oxide such as aluminum hydroxide or calcium oxide, or activated carbon.

In the organic EL display device 1 of this embodiment, as illustrated in FIG. 2, a moisture high-permeable layer 16 in the form of a frame is disposed between the TFT substrate 2 and the opposite substrate 3 in a surrounding relation to the desiccant layer 15. Outside the moisture high-permeable layer 16, the sealing member 5 is disposed between the TFT substrate 2 and the opposite substrate 3 in a surrounding relation to the moisture high-permeable layer 16. Moreover, in the organic EL display device 1 of this embodiment, the desiccant layer 15 and the moisture high-permeable layer 16 are in close contact with each other, and the moisture high-permeable layer 16 and the sealing member 5 are in close contact with each other. In the organic EL display device 1 of this embodiment, after moisture having penetrated through the sealing member 5 is diffused in the moisture high-permeable layer 16, the moisture is captured and absorbed by the desiccant layer 15 (as described in detail later).

Preferably, a material having a higher moisture permeation rate than that of the sealing member 5 is used as the moisture high-permeable layer 16. More specifically, the moisture high-permeable layer 16 is made of a resin material, e.g., an acryl resin, a polyimide resin, an epoxy resin, a phenol resin, or polyethylene. When the moisture permeation rate of the sealing member 5 is 20 g/m$^2$·day, for example, the material, the film thickness and so on of the moisture high-permeable layer 16 are preferably set such that the moisture high-permeable layer 16 has the moisture permeation rate of 100 g/m$^2$·day. Additionally, because the moisture high-permeable layer 16 is disposed outside the pixel region A (namely, outside a display area) as illustrated in FIG. 1, the moisture high-permeable layer 16 can be made of a transparent material or an opaque material regardless of whether the organic EL display device 1 is the top emission type or the bottom emission type.

Figure 3:
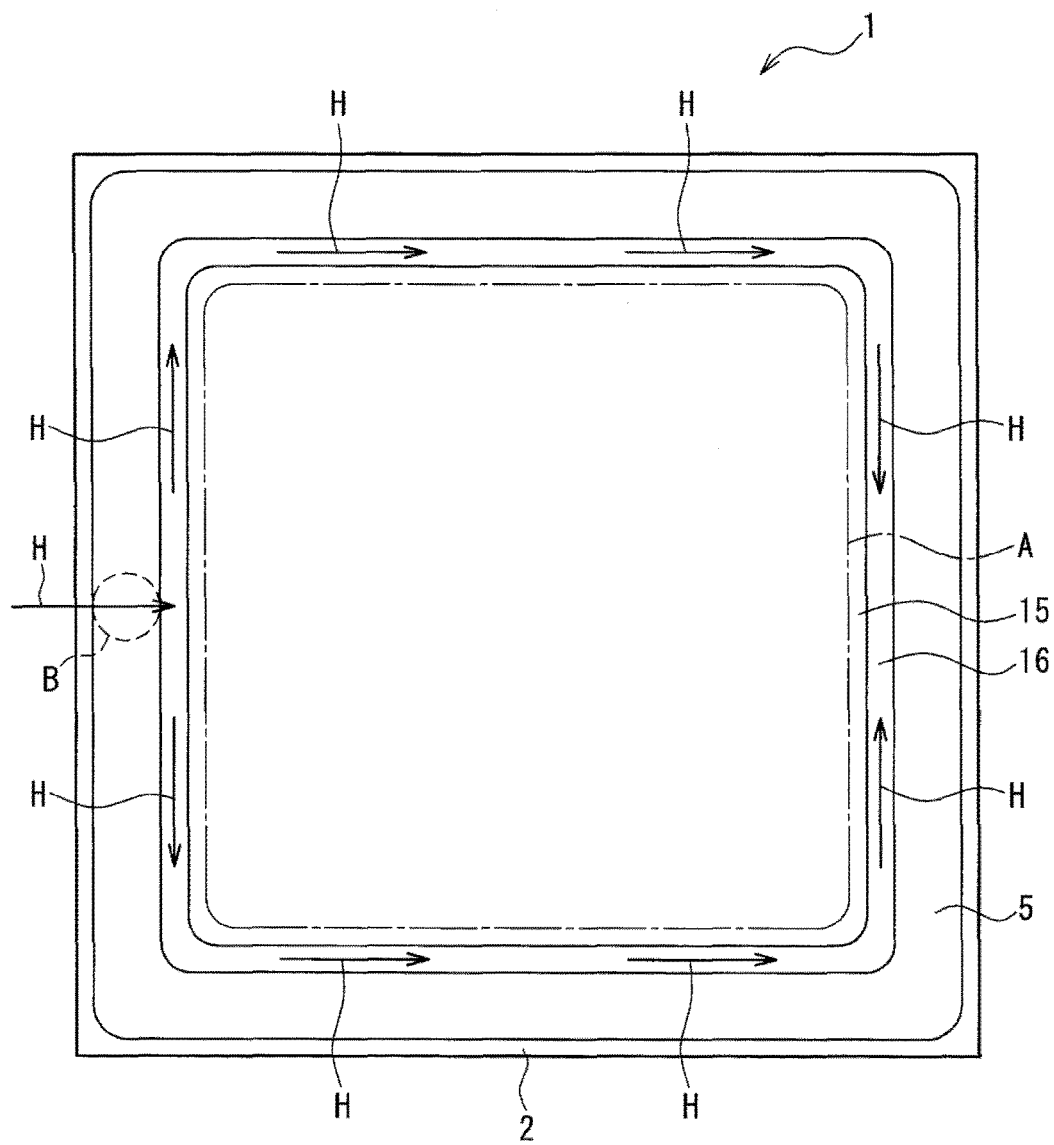
FIG. 3 is an explanatory view referenced to explain a practical advantageous effect of a moisture high-permeable layer illustrated in FIG. 1.

A practical advantageous effect of the moisture high-permeable layer 16 in the organic EL display device 1 of this embodiment is described here with reference to FIG. 3.

FIG. 3 is an explanatory view referenced to explain the practical advantageous effect of the moisture high-permeable layer illustrated in FIG. 1.

If the sealing member 5 includes a portion where the moisture resistant performance is relatively low (as denoted by "B", for example, in FIG. 3) due to influences of defects caused by foreign matters or depletions, poor coatability over irregularities in surfaces of the TFT substrate 2 and the opposite substrate 3, and surface conditions (material properties, wettability, etc.) of the TFT substrate 2 and the opposite substrate 3, an amount of moisture penetrating through that portion increases. In such a case, if the moisture high-permeable layer 16 is not present, the moisture is directly taken into the desiccant layer 15. Therefore, an amount of moisture absorbed by the desiccant layer 15 in its region contacting the above-described portion of the sealing member 5 increases locally. This may result in a possibility of causing saturation in the amount of the absorbed moisture, permeation of the moisture into pixels, and/or cracking of the desiccant layer 15, and further a possibility of reducing display quality.

On the contrary, in the organic EL display device 1 of this embodiment, since the moisture high-permeable layer 16 is present, moisture is diffused in the moisture high-permeable layer 16 as denoted by arrows "H" in FIG. 3. Thereafter, the moisture is taken into the desiccant layer 15. In other words, because of moisture being diffused in the moisture high-permeable layer 16 over its entirety, even if the sealing member 5 includes the portion where the moisture resistant performance is relatively low as denoted by "B", for example, in FIG. 3, the moisture can be absorbed by the entirety of the desiccant layer 15 in a promoted manner without being locally absorbed by the desiccant layer 15 near the above-mentioned portion. As a result, even if the above-mentioned portion where the moisture resistant performance is relatively low is present in the sealing member 5, reduction of the display quality can be prevented in the organic EL display device 1 of this embodiment without causing degradation of the light emission characteristic, degradation of the optical characteristics, and physical damages of the pixels.

A method of manufacturing the organic EL display device 1 of this embodiment will be described in detail below with reference to FIG. 4.

Figure 4:
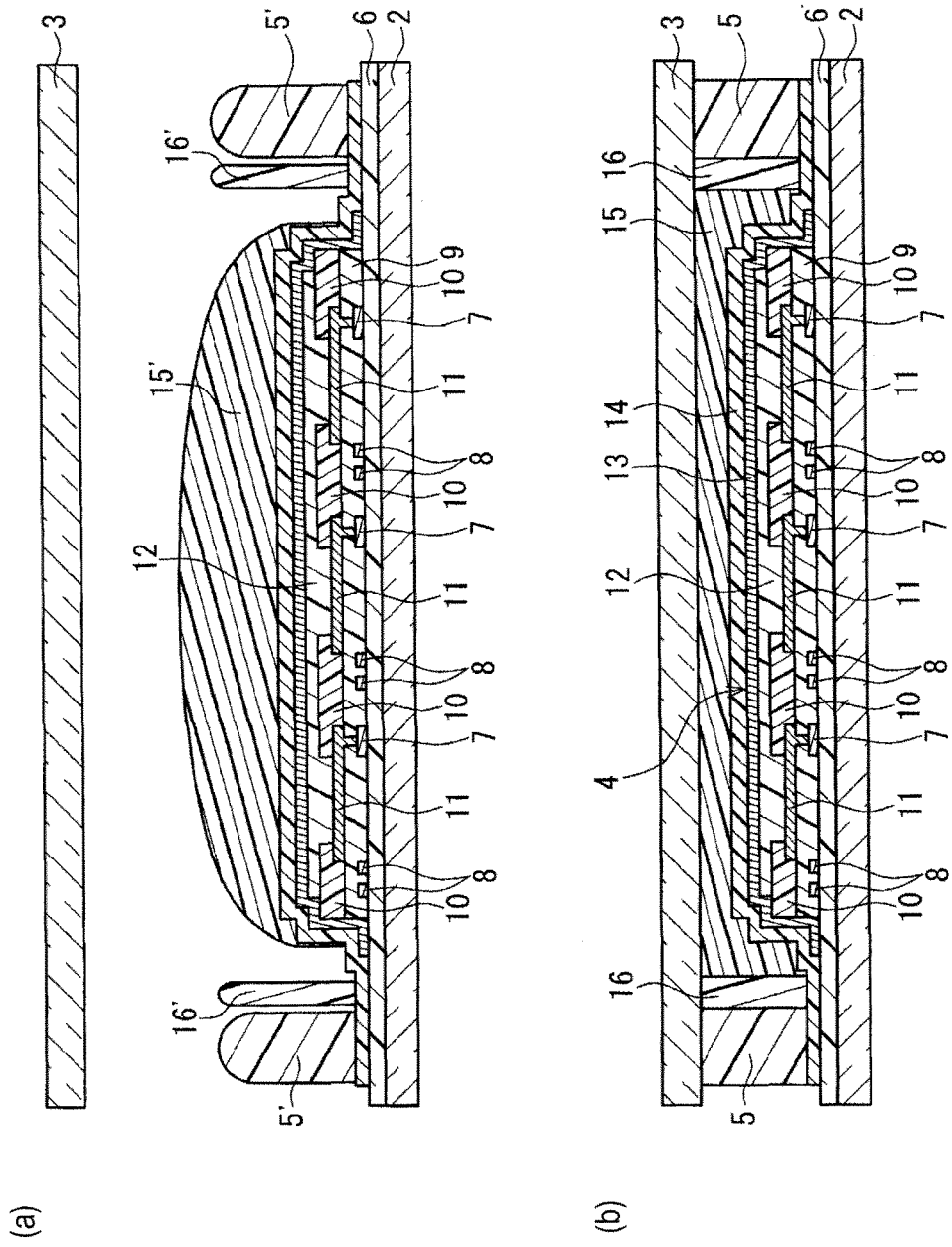
FIG. 4 is an explanatory view referenced to explain main manufacturing steps of the organic EL display device; specifically.

FIG. 4 is an explanatory view referenced to explain main manufacturing steps of the organic EL display device described above. Specifically, FIGS. 4(a) and 4(b) illustrate a series of main manufacturing steps.

As illustrated in FIG. 4(a), a sealing member 5' is coated by nozzle dispense, for example, over a surface of the TFT substrate 2, the surface being positioned on the side facing the opposite substrate 3, in the form of a frame (ring) in a surrounding relation to the pixel region A (FIG. 1). Then, a moisture high-permeable layer 16' is formed by patterning on the above-mentioned surface of the TFT substrate 2 at a position inside the sealing member 5', as illustrated in FIG. 4(a). More specifically, the moisture high-permeable layer 16' is coated in the form of a frame (ring) in a surrounding relation to the pixel region A (FIG. 1) at the position inside the sealing member 5' by the printing method, a photolithography method, a vacuum deposition method, a sputtering method, or a plasma polymerization method, for example.

Then, as illustrated in FIG. 4(a), a desiccant layer 15' is coated on the protective film 14 by dripping. An amount of the dripped desiccant layer 15' is determined depending on the volume of the desiccant layer 15' to be enclosed. As another example, a liquid-crystal dripping method (called an ODF method) may also be used to coat the desiccant layer 15'.

Then, as illustrated in FIG. 4(b), the TFT substrate 2 and the opposite substrate 3 are bonded to each other in a vacuum state by employing, e.g., a vacuum bonding apparatus (not illustrated). With the bonding, the desiccant layer 15 and the moisture high-permeable layer 16 are closely contacted with each other, and the moisture high-permeable layer 16 and the sealing member 5 are closely contacted with each other. After returning to a condition under an atmosphere at atmospheric pressure, the sealing member 5 is cured by carrying out UV exposure and firing on the sealing member 5. At that time, the sealing member 5, the desiccant layer 15, and the moisture high-permeable layer 16 are closely contacted with a surface of the opposite substrate 3. As a result, the organic EL display device 1 of this embodiment is completed.

Apart from the above description, the desiccant layer 15 may be formed by a vacuum deposition method, for example. However, the above-described liquid-crystal dripping method is more preferable for the reason that the manufacturing cost can be held relatively low even when the desiccant layer 15 having a thickness of, e.g., 5 μm or more in the thinnest portion is formed.

Apart from the above description, the TFT substrate 2 and the opposite substrate 3 may be bonded to each other after disposing the sealing member 5', the moisture high-permeable layer 16', and the desiccant layer 15' on a surface of the opposite substrate 3, the surface being positioned on the side facing the TFT substrate 2.

In the organic EL display device 1 of this embodiment constituted as described above, the organic EL element (electroluminescence element) 4 is covered with the desiccant layer 15. Between the TFT substrate (substrate) 2 and the opposite substrate 3, the desiccant layer 15 is surrounded successively by the moisture high-permeable layer having frame-shape 16 and the sealing member having frame-shape 5. With such a structure, the organic EL display device 1 of this embodiment can provide the organic EL display device (electroluminescence device) 1 in which, unlike the above-described related art, moisture can be reliably absorbed by the desiccant layer 15 while local absorption of moisture is avoided. Stated in another way, in the organic EL display device 1 of this embodiment, moisture having penetrated through the sealing member 5 can be caused to diffuse over the entirety of the desiccant layer 15 with the presence of the moisture high-permeable layer 16, and local moisture absorption by the desiccant layer 15 can be avoided. Furthermore, in the organic EL display device 1 of this embodiment, unlike the above-described related art, the thickness of the desiccant layer 15 can be increased without problems, and the moisture absorption performance obtained with the desiccant layer 15 can be increased easily. In addition, even when moisture having been diffused in the moisture high-permeable layer 16 is further diffused toward the organic EL element 4, the moisture has to pass through the desiccant layer 15. Hence the relevant moisture can be reliably absorbed by the desiccant layer 15.

Thus, this embodiment can prevent the occurrence of damage of the light emission characteristics, which may be caused by intrusion of moisture into the pixels in the neighborhood of the desiccant layer, and the occurrence of local cure shrinkage only in a portion of the desiccant layer 15 at or near the outer periphery. Moreover, since cracking of the desiccant layer 15 caused by the local cure shrinkage can be avoided, it is possible to prevent not only degradation of the optical characteristics (such as reduction of transmittance of the desiccant layer 15 and the occurrence of scattering in the top emission structure), but also the occurrence of physical damages of pixels, which may be caused by cracks progressing up to the pixels. As a result, the organic EL display device 1 having good display quality and high reliability can be easily constituted according to this embodiment.

Still further, in this embodiment, the desiccant layer 15 and the moisture high-permeable layer 16 are in close contact with each other, and the moisture high-permeable layer 16 and the sealing member 5 are in close contact with each other. As a result, the organic EL display device 1 having a compact size can be easily constituted according to this embodiment.

In this embodiment, since the moisture high-permeable layer 16 is made of a resin material, the moisture high-permeable layer 16 can be disposed easily.

In this embodiment, since the moisture permeation rate of the moisture high-permeable layer 16 is larger than that of the sealing member 5, the moisture having penetrated through the sealing member 5 is quickly diffused by the moisture high-permeable layer 16 without stagnating at the interface between the sealing member 5 and the moisture high-permeable layer 16. More specifically, if moisture stagnates at the above-mentioned interface, the moisture is more likely to be absorbed by the desiccant layer 15 in the neighborhood of the interface, thus resulting in a possibility that an amount of moisture locally absorbed by the desiccant layer 15 may increase. In contrast, this embodiment can reliably prevent an increase in an amount of moisture locally absorbed by the desiccant layer 15.

Apart from the above description, the desiccant layer 15 may contain substances having an oxygen adsorptive property, e.g., metal particles such as iron or aluminum, or organic substances that are susceptible to oxidation.

Second Embodiment

Figure 5:
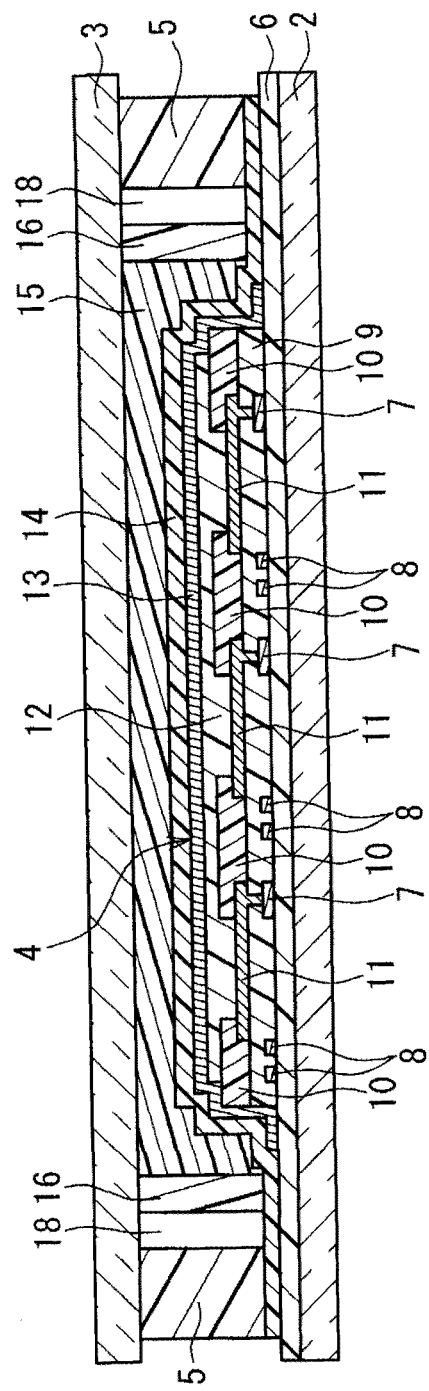
FIG. 5 is a sectional view referenced to explain an organic EL display device according to a second embodiment of the present invention.
Figure 6:
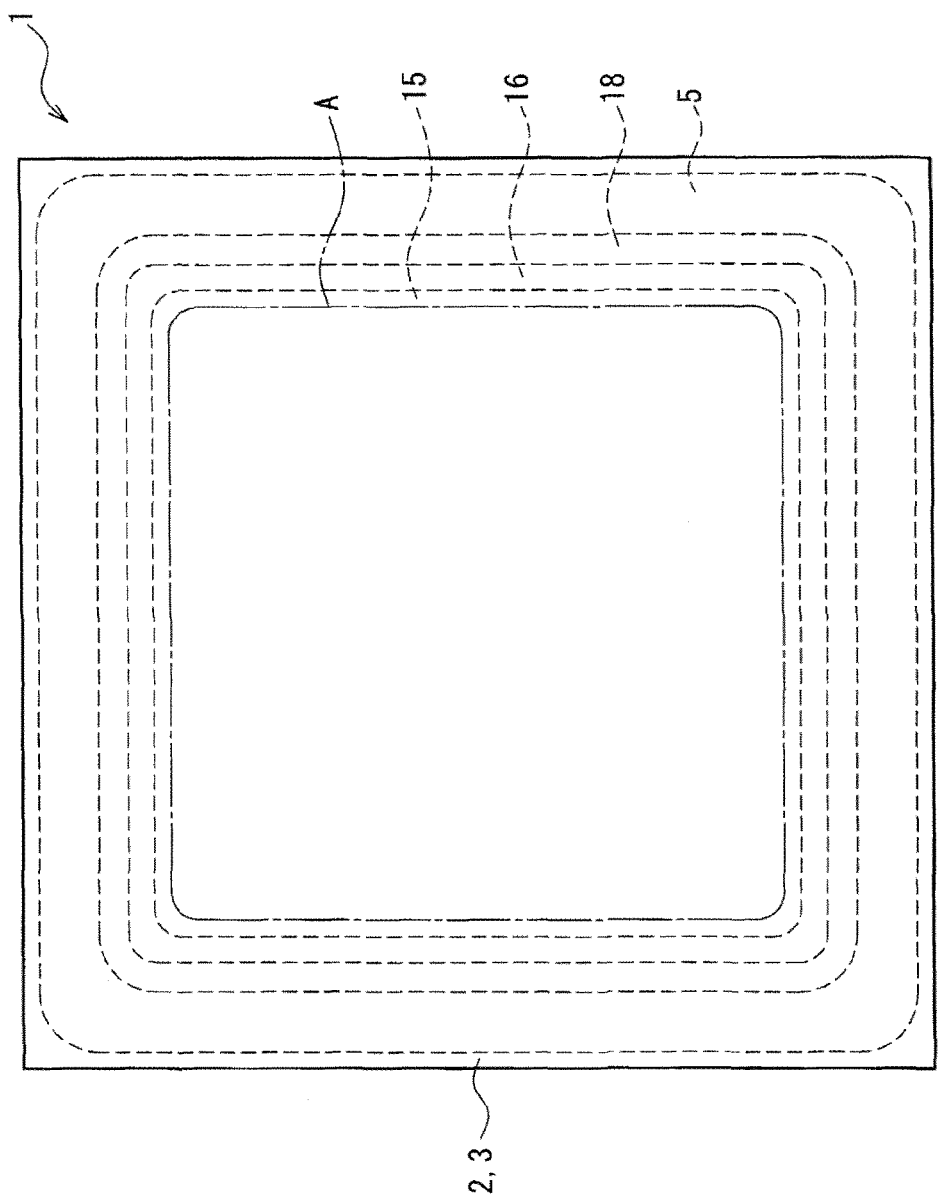
FIG. 6 is a plan view of the organic EL display device illustrated in FIG. 5.

FIG. 5 is a sectional view referenced to explain an organic EL display device according to a second embodiment of the present invention. FIG. 6 is a plan view of the organic EL display device illustrated in FIG. 5.

In those drawings, the second embodiment is mainly different from the above first embodiment in that a first hollow region is disposed between the sealing member and the moisture high-permeable layer. It is to be noted that elements common to those in the above first embodiment are denoted by the same signs, and duplicate description of those elements is omitted.

More specifically, as illustrated in FIGS. 5 and 6, in the organic EL display device 1 of this embodiment, the first hollow region 18 in the form of a frame is disposed between the sealing member 5 and the moisture high-permeable layer 16. The first hollow region 18 is held in a state under low pressure of not higher than 1 Pa or a state filled with inert gas.

When the first hollow region 18 is to be held in a vacuum state, the TFT substrate 2 and the opposite substrate 3 are bonded to each other under a condition held at a vacuum level of not higher than 1 Pa.

With the constitution described above, the second embodiment can also provide similar operations and advantageous effects to those in the above first embodiment. Moreover, in the second embodiment, the first hollow region 18 is disposed between the sealing member 5 and the moisture high-permeable layer 16. In the second embodiment, therefore, moisture having penetrated through the sealing member 5 can be caused to further diffuse in the first hollow region 18. It is hence possible to more reliably prevent the occurrence of local moisture absorption by the moisture high-permeable layer 16, and the occurrence of local moisture absorption by the desiccant layer 15.

As the size of the first hollow region 18 increases, the first hollow region 18 exhibits higher moisture diffusion performance. However, if the width of the first hollow region 18 (i.e., the distance between the sealing member 5 and the moisture high-permeable layer 16) is so wide, the size of a non-pixel region (frame region) of the organic EL display device 1 increases, thus resulting in a possibility of adversely affecting commodity design. Therefore, the width of the first hollow region 18 needs to be designed to fall within a range where the allowable moisture diffusion performance is obtained from the viewpoint of design. More specifically, the width of the first hollow region 18 is, e.g., 50 μm to 1000 μm, typically about 300 μm.

Furthermore, in this embodiment, the first hollow region 18 is held in the state under low pressure of not higher than 1 Pa or the state filled with inert gas. As a result, the first hollow region 18 can be disposed in a more appropriate condition in this embodiment.

Third Embodiment

Figure 7:
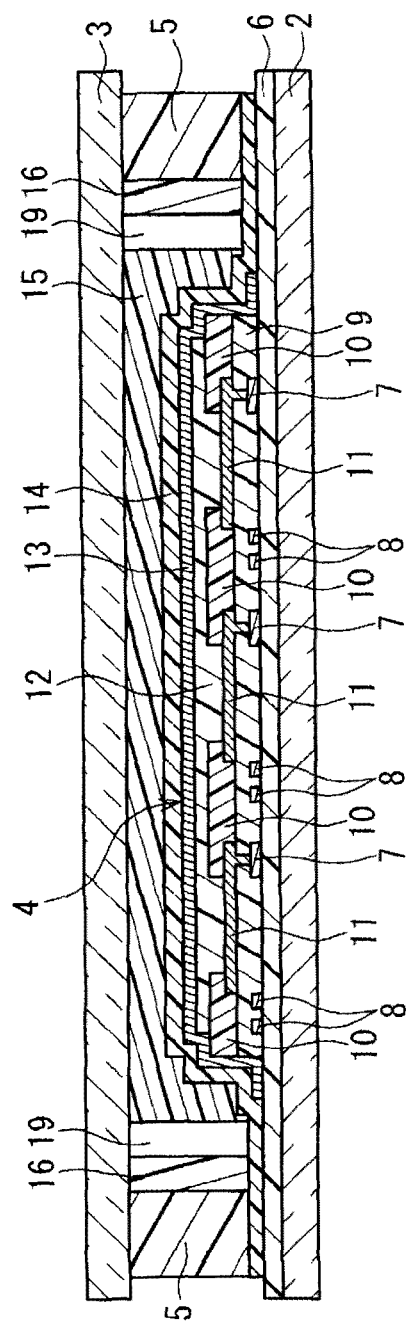
FIG. 7 is a sectional view referenced to explain an organic EL display device according to a third embodiment of the present invention.

FIG. 7 is a sectional view referenced to explain an organic EL display device according to a third embodiment of the present invention. FIG. 8 is a plan view of the organic EL display device illustrated in FIG. 7.

In those drawings, the third embodiment is mainly different from the above first embodiment in that a second hollow region is disposed between the moisture high-permeable layer and the desiccant layer. It is to be noted that elements common to those in the above first embodiment are denoted by the same signs, and duplicate description of those elements is omitted.

More specifically, as illustrated in FIGS. 7 and 8, in the organic EL display device 1 of this embodiment, the second hollow region 19 in the form of a frame is disposed between the moisture high-permeable layer 16 and the desiccant layer 15. As in the first hollow region 18, the second hollow region 19 is also held in a state under low pressure of not higher than 1 Pa or a state filled with inert gas.

When the second hollow region 19 is to be held in a vacuum state, the TFT substrate 2 and the opposite substrate 3 are bonded to each other in a state held at a vacuum level of not higher than 1 Pa.

With the constitution described above, the third embodiment can also provide similar operations and advantageous effects to those in the above first embodiment. Moreover, in the third embodiment, the second hollow region 19 is disposed between the moisture high-permeable layer 16 and the desiccant layer 15. In the third embodiment, therefore, moisture having penetrated through the sealing member 5 and the moisture high-permeable layer 16 can be caused to further diffuse in the second hollow region 19. It is hence possible to more reliably prevent the occurrence of local moisture absorption by the desiccant layer 15.

As the size of the second hollow region 19 increases, the second hollow region 19 exhibits higher moisture diffusion performance. However, if the width of the second hollow region 19 (i.e., the distance between the moisture high-permeable layer 16 and the desiccant layer 15) is so wide, the size of the non-pixel region (frame region) of the organic EL display device 1 increases, thus resulting in a possibility of adversely affecting commodity design. Therefore, the width of the second hollow region 19 needs to be designed to fall within a range where the allowable moisture diffusion performance is obtained from the viewpoint of design. More specifically, the width of the second hollow region 19 is, e.g., 50 μm to 1000 μm, typically about 300 μm.

Furthermore, in this embodiment, the second hollow region 19 is held in the state under low pressure of not higher than 1 Pa or the state filled with inert gas. As a result, the second hollow region 19 can be disposed in a more appropriate condition in this embodiment.

It is to be noted that the above-described embodiments are in all respects illustrative and not restrictive. The technical scope of the present invention is specified by the claims, and all modifications falling within the scope equivalent to the features stated in the claims are also involved in the present invention.

For example, while the above description has been made in connection with the case where the organic EL element is used as the electroluminescence element, the present invention is not limited to that case. In another example, an inorganic EL element comprising an inorganic compound may be used.

While the above description has been made in connection with the case where the present invention is applied to the organic EL display device, the present invention is not limited to that case. In another example, the present invention may be applied to an illumination device, such as a backlight device.

Apart from the above description, the second and third embodiments may be combined with each other in appropriate ways.

INDUSTRIAL APPLICABILITY

The present invention is usefully applied to the electroluminescence device in which moisture is to be reliably absorbed by a desiccant layer while local absorption of moisture is avoided.

REFERENCE SIGNS LIST

1 organic EL display device (electroluminescence device)
2 TFT substrate (substrate)
3 opposite substrate
4 organic EL element (electroluminescence element)
5 sealing member
15 desiccant layer
16 moisture high-permeable layer
18 first hollow region
19 second hollow region

The invention claimed is:

1. An electroluminescence device comprising a substrate and an electroluminescence element disposed on the substrate, the electroluminescence device further comprising:
    an opposite substrate disposed in an opposite relation to the substrate and positioned on same side as the electroluminescence element;
    a desiccant layer disposed between the substrate and the opposite substrate and covering the electroluminescence element;

a moisture high-permeable layer having frame-shape, the moisture high-permeable layer disposed between the substrate and the opposite substrate and surrounding the desiccant layer; and a sealing member having frame-shape, the sealing member disposed between the substrate and the opposite substrate, surrounding the moisture high-permeable layer, and sealing off the electroluminescence element in cooperation with the opposite substrate; wherein a first hollow region is disposed between the sealing member and the moisture high-permeable layer.

2. The electroluminescence device according to claim 1, wherein the first hollow region is held in a state under low pressure of not higher than 1 Pa or a state filled with inert gas.

3. The electroluminescence device according to claim 1, wherein a second hollow region is disposed between the moisture high-permeable layer and the desiccant layer.

4. The electroluminescence device according to claim 3, wherein the second hollow region is held in a state under low pressure of not higher than 1 Pa or a state filled with inert gas.

5. An electroluminescence device, comprising a substrate and an electroluminescence element disposed on the substrate, the electroluminescence device further comprising:

an opposite substrate disposed in an opposite relation to the substrate and positioned on same side as the electroluminescence element;

a desiccant layer disposed between the substrate and the opposite substrate and covering the electroluminescence element;

a moisture high-permeable layer having frame-shape, the moisture high-permeable layer disposed between the substrate and the opposite substrate and surrounding the desiccant layer; and a sealing member having frame-shape, the sealing member disposed between the substrate and the opposite substrate, surrounding the moisture high-permeable layer, and sealing off the electroluminescence element in cooperation with the opposite substrate; wherein a moisture permeation rate of the moisture high-permeable layer is higher than a moisture permeation rate of the sealing member.

6. The electroluminescence device according to claim 1, wherein the moisture high-permeable layer is made of a resin material.

7. The electroluminescence device according to claim 1, wherein the moisture high-permeable layer is made of one selected from the group consisting of an epoxy resin, a phenol resin, and polyethylene.

8. The electroluminescence device according to claim 1, wherein the moisture high-permeable layer is made of an opaque material.

9. The electroluminescence device according to claim 1, further comprising:

a pixel region including a plurality of the electroluminescence elements;

a non-pixel region surrounding the pixel region; and a protective film disposed between the electroluminescence element and the desiccant layer, wherein the protective film extends from the pixel region to the non-pixel region.

10. The electroluminescence device according to claim 9, wherein the moisture high-permeable layer is provided over the protective film.

11. The electroluminescence device according to claim 9, wherein the sealing member is provided over the protective film.

12. The electroluminescence device according to claim 9, wherein a first hollow region is disposed between the sealing member and the moisture high-permeable layer, and wherein the moisture high-permeable layer and the first hollow region are provided over the protective film.

13. The electroluminescence device according to claim 12, wherein a second hollow region is disposed between the moisture high-permeable layer and the desiccant layer, and wherein the second hollow region is provided over the protective film.

14. The electroluminescence device according to claim 5, wherein the desiccant layer and the moisture high-permeable layer are in close contact with each other, and the moisture high-permeable layer and the sealing member are in close contact with each other.

15. An electroluminescence device comprising a substrate and an electroluminescence element disposed on the substrate, the electroluminescence device further comprising:

an opposite substrate disposed in an opposite relation to the substrate and positioned on same side as the electroluminescence element;

a desiccant layer disposed between the substrate and the opposite substrate and covering the electroluminescence element;

a moisture high-permeable layer having frame-shape, the moisture high-permeable layer disposed between the substrate and the opposite substrate and surrounding the desiccant layer;

a sealing member having frame-shape, the sealing member disposed between the substrate and the opposite substrate, surrounding the moisture high-permeable layer, and sealing off the electroluminescence element in cooperation with the opposite substrate;

a pixel region including a plurality of the electroluminescence elements;

a non-pixel region surrounding the pixel region; and a protective film disposed between the electroluminescence element and the desiccant layer, wherein the protective film extends from the pixel region to the non-pixel region, and the moisture high-permeable layer is provided over the protective film.

16. The electroluminescence device according to claim 15, wherein the sealing member is provided over the protective film.

17. The electroluminescence device according to claim 15, wherein a first hollow region is disposed between the sealing member and the moisture high-permeable layer, and wherein the moisture high-permeable layer and the first hollow region are provided over the protective film.

18. The electroluminescence device according to claim 17, wherein a second hollow region is disposed between the moisture high-permeable layer and the desiccant layer, and wherein the second hollow region is provided over the protective film.

* * * * *